(12) United States Patent
Ashar et al.

(10) Patent No.: US 9,965,575 B2
(45) Date of Patent: May 8, 2018

(54) METHODS AND SYSTEMS FOR CORRECTING X-PESSIMISM IN GATE-LEVEL SIMULATION OR EMULATION

(71) Applicant: Pranav Ashar, Sunnyvale, CA (US)

(72) Inventors: Pranav Ashar, Belle Mead, NJ (US); Ian Andrew Guyler, Portland, OR (US); Sanjeev Mahajan, Mountain View, CA (US)

(73) Assignee: Real Intent, Inc., Sunnyvale, CA (US)

( * ) Notice: Subject to any disclaimer, the term of this patent is extended or adjusted under 35 U.S.C. 154(b) by 0 days. days.

(21) Appl. No.: 15/266,455

(22) Filed: Sep. 15, 2016

(65) Prior Publication Data

US 2017/0083650 A1    Mar. 23, 2017

Related U.S. Application Data

(60) Provisional application No. 62/220,943, filed on Sep. 18, 2015.

(51) Int. Cl.
*G06F 17/50* (2006.01)
(52) U.S. Cl.
CPC ................. *G06F 17/5027* (2013.01)
(58) Field of Classification Search
CPC ........ G06F 9/455; G06F 11/26; G06F 11/261; G06F 17/5009; G06F 17/5022; G06F 17/5027; G06F 17/5031; G06F 2217/86
USPC .......................................... 716/101–102, 106
See application file for complete search history.

(56) References Cited

U.S. PATENT DOCUMENTS

| | | | | |
|---|---|---|---|---|
| 6,714,902 B1* | 3/2004 | Chao | ................... | G06F 17/5031 703/13 |
| 8,977,998 B1* | 3/2015 | Azizi | .................. | G06F 17/5031 716/106 |
| 2007/0011527 A1* | 1/2007 | Goswami | ....... | G01R 31/318547 714/726 |
| 2012/0072876 A1* | 3/2012 | Salz | ...................... | G06F 17/504 716/102 |
| 2012/0240087 A1* | 9/2012 | Chang | ................. | G06F 17/5031 716/102 |

* cited by examiner

*Primary Examiner* — Paul Dinh

(57) ABSTRACT

Methods and systems are described to augment gate-level simulation with the ability to efficiently detect and correct X-pessimism on-the-fly. Using static Boolean analysis, gates are identified in the simulated hardware where there is potential for the simulator to propagate an X while the actual hardware propagates a 1 or 0, i.e. gates where X-pessimism potentially occurs. Data regarding potentially pessimistic gates is utilized in real time during simulation to determine actual pessimism at the gate and to correct it when it happens. Whereas the understanding of X-pessimism and the method of augmenting simulation with attributes to correct X-pessimism in simulation on-the-fly is known in the public domain preceding known patents, various methods have been proposed recently to make on-the-fly X-pessimism correction more efficient for large ICs. The methods and systems described in the present invention, achieve new levels of performance and scalability of X-pessimism detection and correction.

19 Claims, 12 Drawing Sheets

Detailed embodiment for X-accurate gate level simulation.

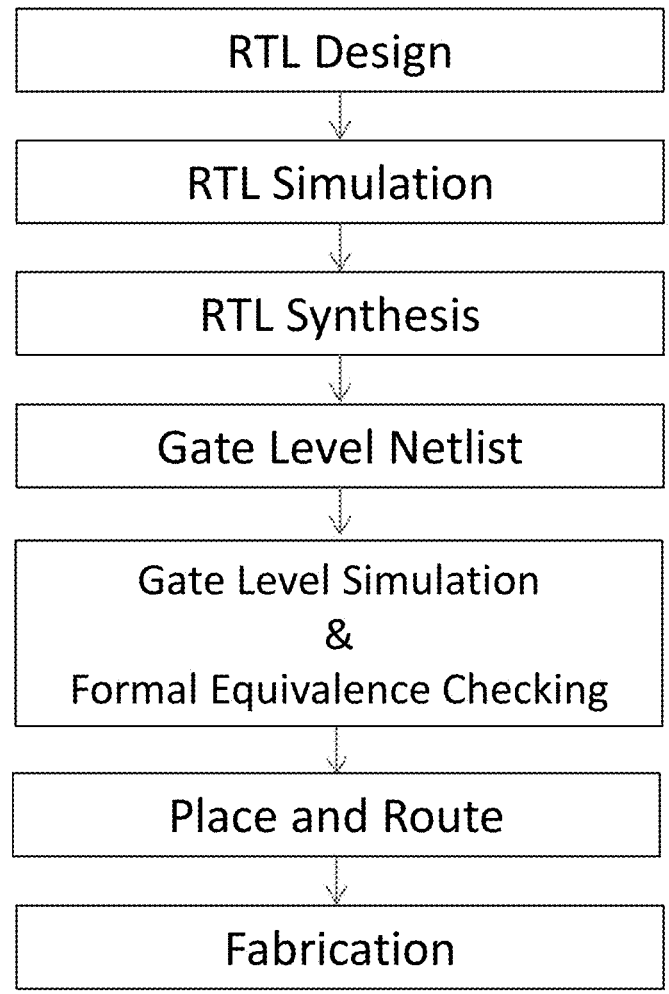
FIG. 1    IC Design Flow

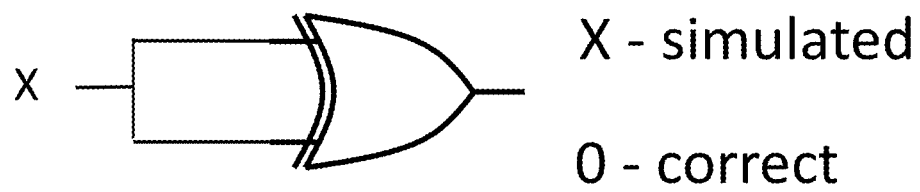
FIG. 2  X-pessimism in an XOR gate

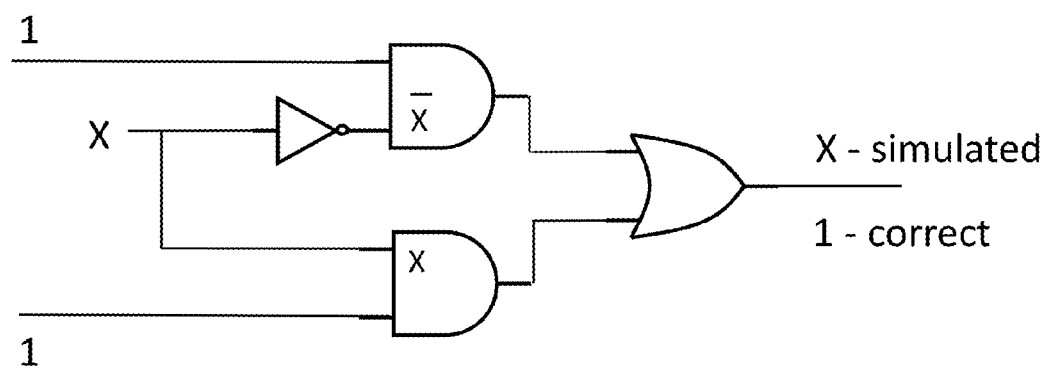
FIG. 3   X-pessimism in an And-Or Mux

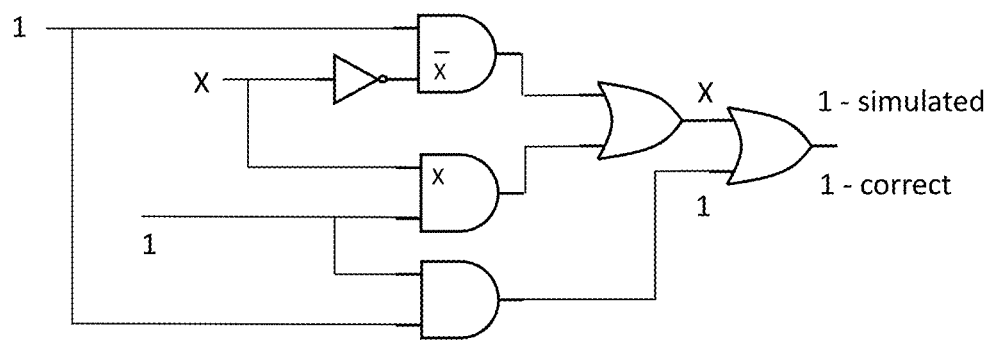
FIG. 4   Mux with bypass to fix X-pessimism

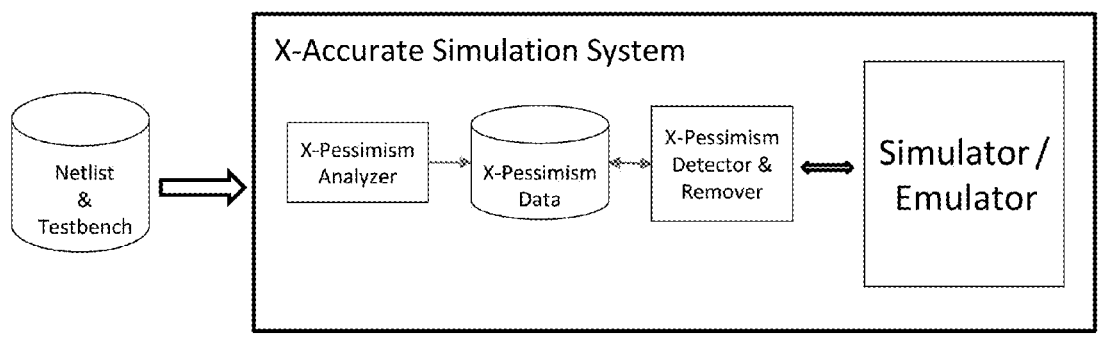
FIG. 5  System for X-accurate gate-level simulation.

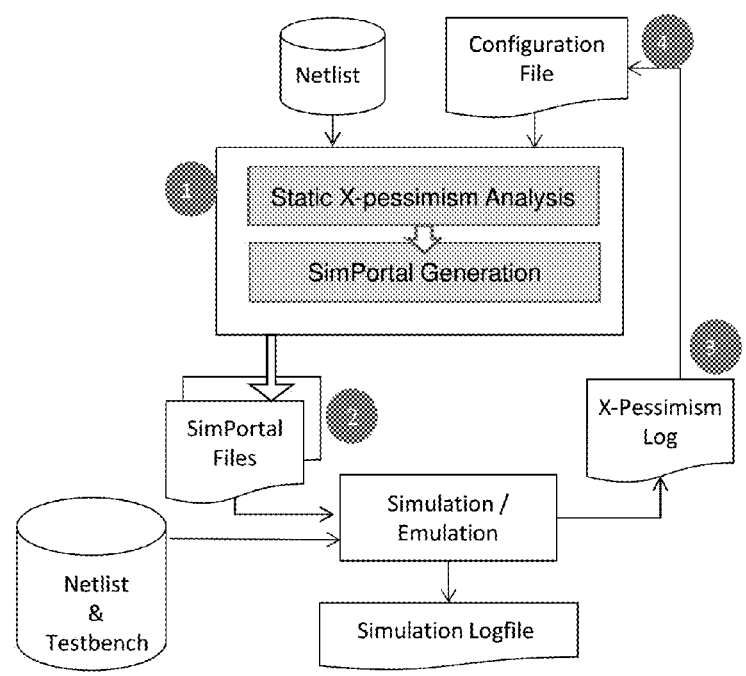
FIG. 6  Detailed embodiment for X-accurate gate level simulation.

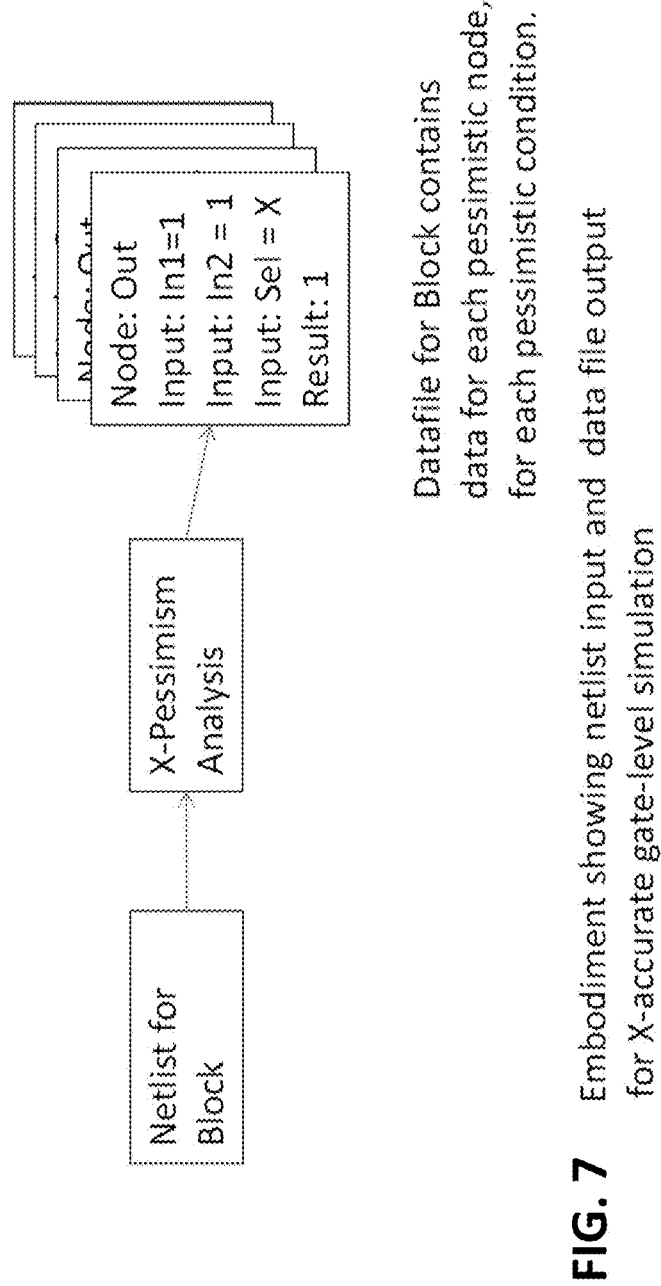
FIG. 7 Embodiment showing netlist input and data file output for X-accurate gate-level simulation

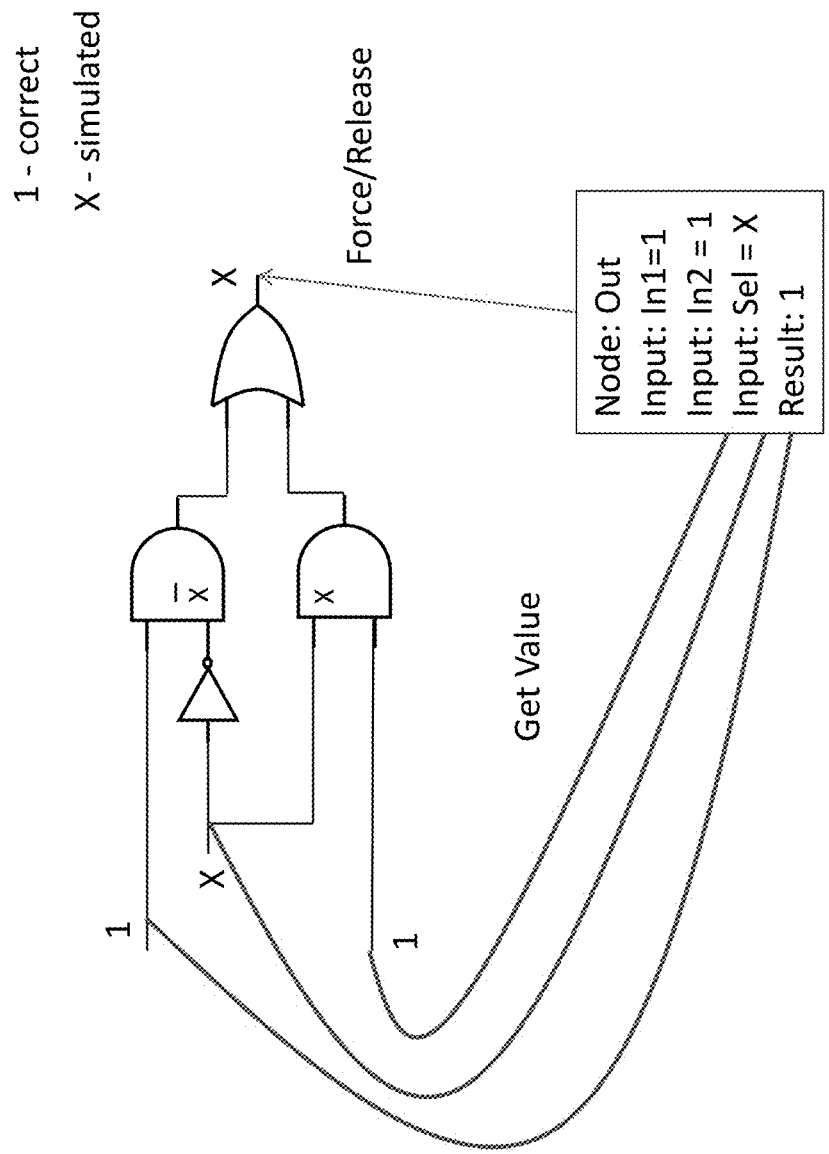
FIG. 8  Mux with data-driven VPI correction

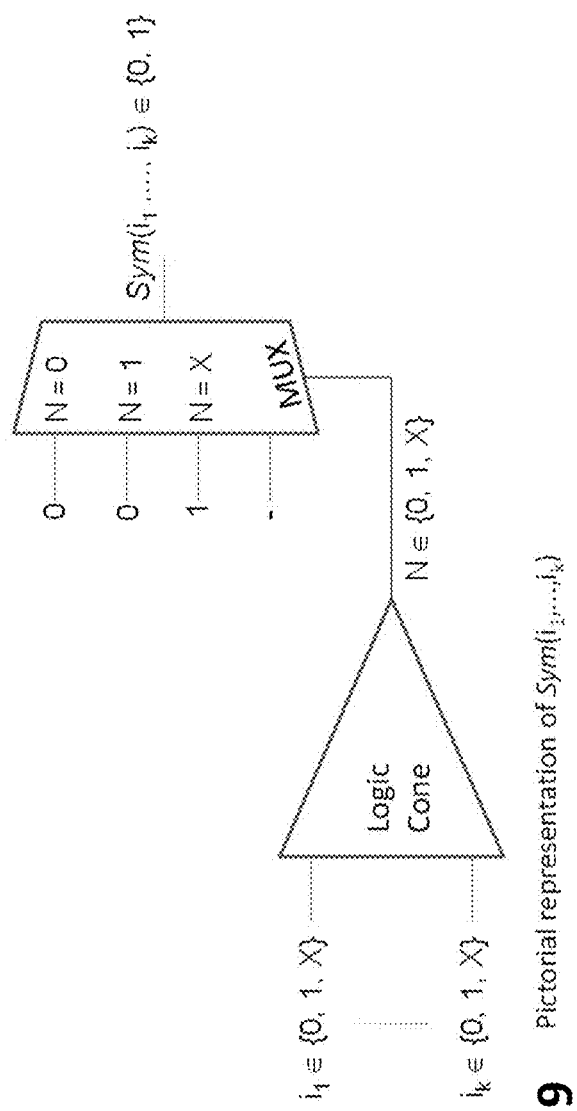
FIG. 9 Pictorial representation of $Sym(i_1,...,i_k)$

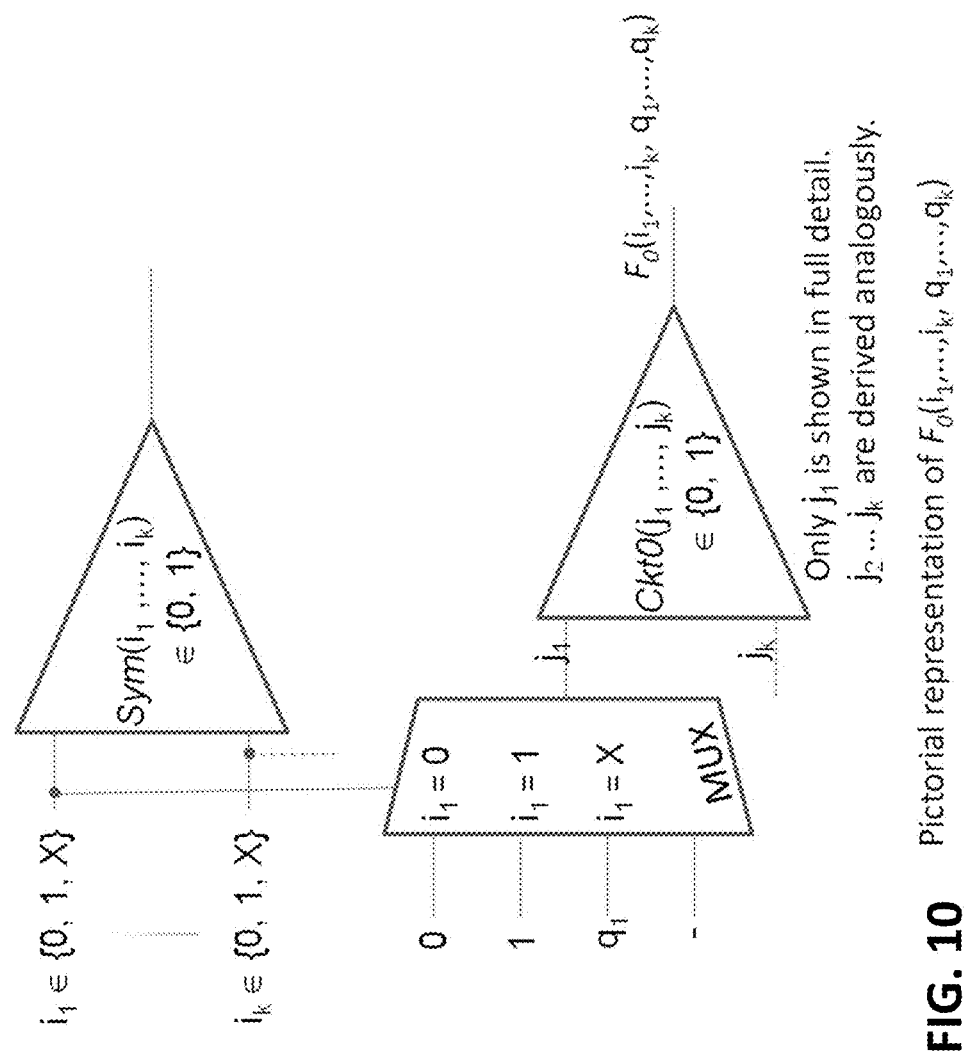
FIG. 10 Pictorial representation of $F_0(i_1,...,i_k, q_1,...,q_k)$

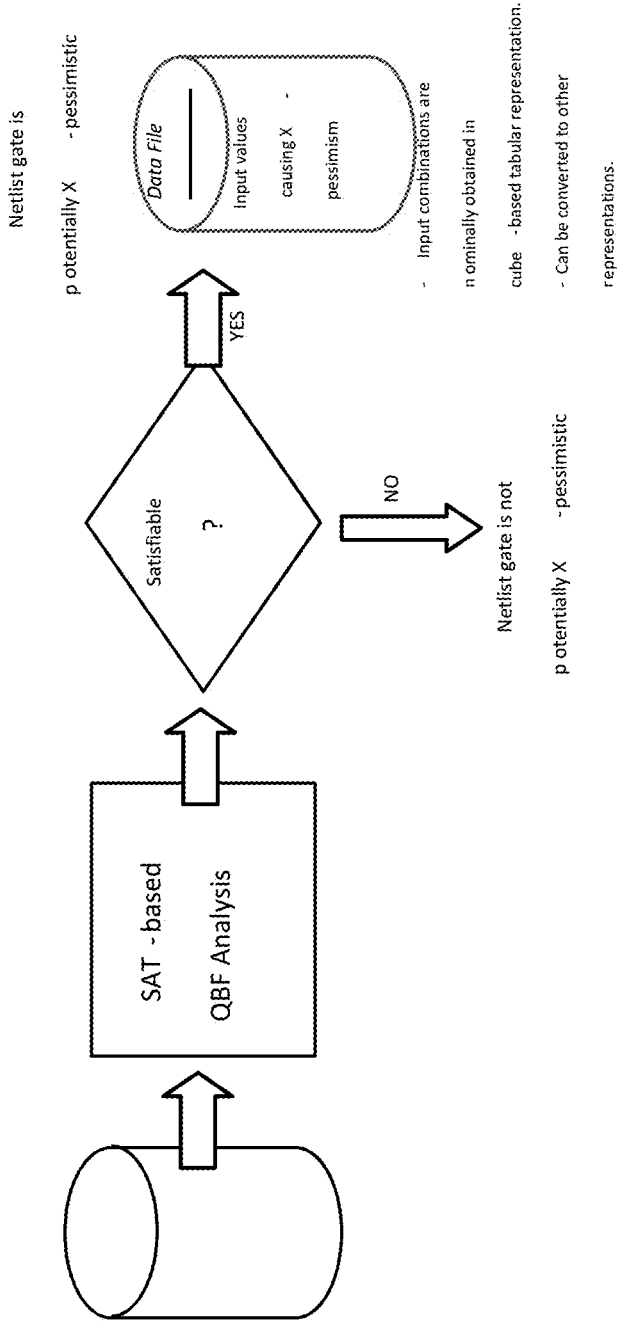
FIG. 11 SAT-Solver-based potential X-pessimism determination at a netlist gate

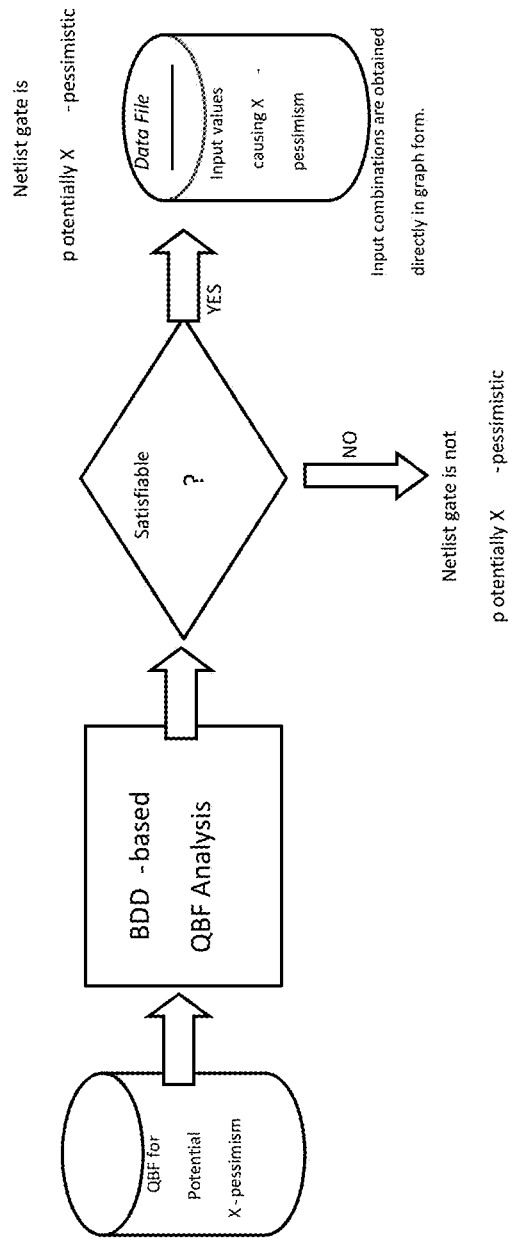
FIG. 12 BDD-based potential X-pessimism determination at a netlist gate

METHODS AND SYSTEMS FOR CORRECTING X-PESSIMISM IN GATE-LEVEL SIMULATION OR EMULATION

CROSS REFERENCE TO PRIOR-FILED APPLICATIONS

The present application claims dependence to prior-filed U.S. provisional patent application titled "Methods and Systems for Correcting X-Pessimism in Gate-Level Simulation or Emulation" dated Sep. 18, 2015 with application No. 62/220,943 and EFS ID 23544426.

REFERENCES CITED

U.S. Patent Documents

U.S. Pat. No. 9,058,452
U.S. Pat. No. 8,402,405
U.S. Pat. No. 8,650,513

Other References

Chang et al., "Improving Gate Level Simulation Accuracy when unknowns exist", Jun. 3, 2012, ACM, pp. 1-5.
Choe et al., "Finding reset nondeterminism in RTL designs—Scalable X-analysis methodology and case study", 2010, EDAA. pp. 1-6.
Chang, et al., "Handling Nondeterminism in Logic Simulation So That Your Waveform Can Be Trusted Again", "D & T Early Access" . . . Publisher: IEEE, Published in: US Mar. 7, 2013.

FIELD OF INVENTION

Gate-level simulation is the final functional verification step prior to the tape-out of an integrated circuit, and has sign-off level importance in the design flow. The preponderance of Xs during gate-level simulation, and the X-pessimism phenomenon, where the simulation values don't reflect what the actual hardware being simulated would do, is cause for considerable delay and overhead in the successful use and completion of gate-level simulation.

The present invention addresses this issue by providing methods and systems by the use of which X-pessimism is efficiently detected upfront and corrected on-the-fly. Consequently, gate-level simulation can be successfully completed more rapidly. Without this invention, multiple man-months can get spent investigating false failures in the gate-level simulation.

BACKGROUND OF INVENTION

The implementation of an integrated circuit (IC) begins with a programmatic representation of the hardware embedded in it. The programmatic representation is nominally created using a Hardware Description Language (HDL), for example System Verilog or VHDL. The programmatic description is systematically refined to a level of detail from which the IC can be manufactured using a semiconductor foundry manufacturing process.

Two intermediate representation levels that are nominally adjacent to each other are the Register Transfer Level (RTL) and the Gate Level. Both are representations of the logic circuits and state-holding elements implementing the hardware. Whereas the RTL representation is nominally in terms of technology-independent logic expressions and software-program-like constructs, the gate-level representation (also called the gate-level netlist) is nominally a logic circuit representation in terms of a library of logic cells implementing combinational gates (e.g. AND, XOR, OR gates), storage elements (e.g. flip-flops, latches) and connecting wires (also called "nets"). The nets could serve as inputs into the netlist, as outputs of the netlist, or as interconnections between logic gates, storage elements or a mix thereof. The "cell library" is nominally developed in collaboration with the manufacturing foundry and is characterized for area, delay, power etc as part of that process. A gate-level netlist is typically produced automatically from an RTL representation by the process of "synthesis" by using a "synthesis tool" software program. The typical design flow is shown in FIG. 1.

Gate-level simulation is the process of simulating the effect of input stimuli applied to the gate-level netlist. A combination of RTL versus gate-level formal equivalence checking, and gate-level simulation is used for functionally validating the gate-level netlist. This is also shown in FIG. 1. Emulation or hardware-accelerated simulation is nominally the same as simulation using a "software simulator", with the difference that the model of the design being simulated is implemented on special-purpose hardware intended to speed up the simulation. Gate-level netlist validation is nominally the final functional validation step before physical design. As a result, gate-level simulation is a very important step in the IC design process and must be enabled with minimum overhead and must be maximally efficient in terms of performance and its use of human and computer resources. The presence of X values on nets is a major impediment in the successful use and completion of gate-level simulation.

At any given time in gate-level simulation, some of the nets may have unknown values. For example, an input net might not have a value specified, a storage element might be uninitialized, or the combined output of interacting internal logic elements like tristate buffers might be unresolved. When the value on a net in the actual hardware is unknown, it is still one of either 0 or 1. In other words, in the actual hardware the values on nets are binary. On the other hand, an unknown value on a net in gate-level simulation is represented as a symbol "X" distinct from 0 and 1. In fact, gate-level simulation also allows for additional symbols other than 0, 1 or X as net values, which do not need to be considered for the purpose of this disclosure without loss of generality. In effect, gate-level simulation models each logic and storage element as a multi-valued input-output function. For the purpose of the present invention, it is convenient and sufficient to model any value other than 0 or 1 effectively as an X.

The ternary simulation in the presence of 0, 1 and X on the nets of the gate-level simulation model deviates from the actual hardware in the determination of 0, 1 and unknown values on nets driven by logic elements when a logic element has X values on multiple of its inputs such that the unknown values represented by the X values on the different inputs are correlated to each other.

A simple example of such an occurrence would be an XOR gate with two inputs such that each input has an X value and the X values both originate at the same source. In the actual hardware, the two inputs of the XOR gate would either both be 1 or both be 0, and the output of the XOR gate in the actual hardware would be a 0 in either case. Gate-level simulation, on the other hand, is limited in that it is unable to track the correlations between the binary values underlying the two Xs and would, as a result, conclude only that the output of the XOR gate is also an X. This phenomenon is called X-pessimism since the simulator takes the safe (pessimistic) decision of propagating an X while the value in the actual hardware resolves to a binary 0 or 1. (FIG. 2)

Another common example is that of an AND-OR multiplexor logic element. A multiplexor propagates the value at one of a number of "data" inputs based on the value on its "select" input. Consider a multiplexor with two data inputs and a select input bit that chooses between the two data inputs, and specifically the case where the select input has the value X and the two data inputs are both at value 1. The output value of the multiplexor in the actual hardware would be a 1 regardless of the actual value on the select input, whereas gate-level simulation would compute an X value at the output as a result of X-pessimism. (FIG. 3). Similarly, an OR-AND multiplexor would incorrectly simulate an output value of X when the select input has the value X and the two data inputs have the value 0. In either implementation, if the two data values are different and the select input is at X, the simulated X value is correct. In other words, it is not pessimistic and does not need correction.

X-pessimism has been well known as a limitation of gate-level simulation since the first use of gate-level simulation. X-pessimism is also possible in RTL simulation, and the present invention can be applied to correct X-pessimism in RTL simulation as well.

It is common knowledge that X-pessimism can be avoided by augmenting the circuit implementation of a logic model or a collection of logic models. In the case of a two-input AND-OR multiplexor for instance, an augmentation in the form of an AND gate that has its inputs the two data inputs of the multiplexor, and whose output is ORed with the output of the original multiplexor to obtain the output of the augmented model would correctly compute the output value as 1 when the two data input values are 1 and the select input value is an X. In effect, the augmentation is a bypass path that "knows" when the gate-level simulation would be X-pessimistic and corrects it on the fly. Such augmentation can be done by adding gates to the netlist as shown here or by means of auxiliary code in the simulation testbench that effectively performs the same task. (FIG. 4)

Whereas the possibility of applying such augmentation in specific situations, for example for the aforementioned multiplexor, has been well known, applying such augmentation in the general case where it is desired to correct X-pessimism in situations where the functionality of the logic causing it is not known a priori has been a difficult problem to solve. Some methods have been proposed in this regard in the recent past that are summarized below.

Chang et al. published U.S. Pat. Nos. 9,058,452 and 8,402,405 in which a method was proposed wherein nets in the gate-level model were monitored for X values generated during gate-level simulation, and the X-generating trace was analyzed formally to determine if the X was genuine. If the X was found to be caused by X-pessimism, the correct value was forced on it using auxiliary code in the testbench. U.S. Pat. No. 8,402,405 applied this method for combinational logic cones driving the X value and U.S. Pat. No. 9,058,452 extended it to sequential logic cones. Among the disadvantages of this approach is that time-consuming formal analysis must be applied during simulation and for every X that is produced, causing significant simulation run time overhead. Also, the formal analysis is performed in the context of a specific trace, implying that it may need to be performed again for the same net when an X is produced on it by a different trace. The articles by Chang et al., "Improving Gate Level Simulation Accuracy when unknowns exist", Jun. 3, 2012, ACM, pp. 1-5, and "Handling Nondeterminism in Logic Simulation So That Your Waveform Can Be Trusted Again", D & T Early Access, Publisher: IEEE, Published in: US Mar. 7, 2013, propose similar methods that pivot on generated X values and the corresponding traces.

Salz et al. published U.S. Pat. No. 8,650,513 in which a method was proposed wherein the basic approach is to identify nets that fanout and subsequently reconverge at some logic element in the netlist. Either all nets or user-specified nets downstream from these reconvergent points are marked for X-pessimism analysis during gate-level simulation. The method creates an alternative model with two copies of the logic between the nets that fanout and the nets marked for X-pessimism analysis such that when an X is detected at the fanout points in gate-level simulation, a 0 value and a 1 value are propagated along the net in the two copies of the logic. If the value at the nets marked for X-pessimism analysis are the same in the two copies, the method concludes that the X is pessimistic and corrects it by forcing the value determined in the alternative model. This method has a number of limitations and drawbacks among which are that the determination of the candidates for which to perform this analysis is imprecise and relies on user input, the creation of the alternative model of the logic is burdensome to the simulator in terms of memory as well as performance overhead, and the fact that the method explicitly simulates 0 and 1 values along the alternative paths implies that it is not complete in its ability to handle situations where X values from multiple sources propagate along the logic to the X-pessimism points of interest.

The above two approaches are the closest in terms of attempting to correct X-pessimism on the fly. Various other publications address X-pessimism in gate-level simulation, but do not in any manner impinge on the present invention.

SUMMARY OF INVENTION

The present invention in its various embodiments enables a software tool or computer system that makes logic simulation, such as, gate-level simulation or emulation, easy to complete in the presence of X values on nets by efficiently removing the effects of X-pessimism. This is illustrated in FIG. 5.

The present invention overcomes the disadvantages of the prior art by using Boolean analysis to determine precisely the gates in the netlist at which X-pessimism is possible during logic simulation, i.e. gates where it is possible for the simulator to propagate an X while the actual hardware would propagate a deterministic 0 or 1. These are the potentially X-pessimistic gates.

For each aforementioned potentially X-pessimistic gate, the present invention determines all the value combinations on nets at the inputs to a logic cone driving it, such that for those value combinations the gate is X-pessimistic. In addition, for each such input-value combination, the correct value at the output of the X-pessimistic gate is also determined. This determination of the potentially X-pessimistic gates, input combinations and correct output values is done statically, i.e. prior to gate-level simulation, and further, this information is stored as data files and used during simulation to detect and correct X-pessimism on the fly.

In an illustrative embodiment of the present invention shown in FIG. 6, the input to the system is a logic netlist and the output is one or more data files containing information for each potentially X-pessimistic gate about the aforementioned input-value combinations for which the gate is X-pessimistic and the correct value at the gate output for each such input-value combination. Further in this embodiment, auxiliary code is appended to the simulation testbench for utilizing said data files as lookup data structures to detect X-pessimism during simulation and to apply the correct value to each X-pessimistic gate.

In FIG. 6, Item 1 is the part of the system that statically determines the netlist gates at which X-pessimism is possible and the aforementioned input-value combinations that would cause X-pessimism. Item 2 is the associated X-pessimism data that is generated. Since this data is intended to be used in simulation, it, along with the auxiliary testbench code, is collectively called "SimPortal Files". Item 3 is the X-pessimism detection and correction logs generated during simulation. Item 4 is the optional configuration file that can be generated to guide and improve the static analysis quality-of-results based on user input or X-pessimism logs generated by a prior simulation.

FIG. 7 illustrates an example of data file generation by X-pessimism analysis for accurate gate-level simulation. FIG. 8 illustrates the application of a data file in order to correct X-pessimism in gate-level simulation.

In some embodiments, the input to the system is a collection of netlist partitions such that the said data files are determined individually for each partition or a user-specified subset thereof, and the said auxiliary testbench code utilizes all such data files or a user-specified subset thereof when simulating the complete netlist.

In some embodiments, the value combinations on the nets that are the inputs to the chosen logic cone driving the said potentially X-pessimistic gates are stored in the said data files as a graph-based representation in which each graph node represents a said input or one bit of an encoding of a said input, and the edges emanating from said node represent values assumed by the said input or said encoding bit associated with the said node. In this embodiment, the detection of X-pessimism at a potentially X-pessimistic gate and the determination of the correct value at the gate during simulation is performed by traversing the unique path determined by applying the said input values in the said graph-based representation.

Additional embodiments are described in the detailed disclosure that further improve the efficiency and usability of the system.

The present invention in its various embodiments overcomes the disadvantages of the prior art in at least the following manner:

The potentially X-pessimistic gates are determined using comprehensive Boolean analysis with the derived benefit that the number of such potentially X-pessimistic gates is nominally much lower than the number of X-pessimism candidates determined using structural reconvergence analysis as suggested in U.S. Pat. No. 8,650,513 cited above, or by considering all nets at which an X occurs in simulation as X-pessimism candidates, as suggested in U.S. Pat. Nos. 8,402,405 and 9,058,452 cited above. The smaller number of X-pessimism candidates results in faster simulation and lower memory overhead during simulation.

The determination of the potentially X-pessimistic gates, the value combinations causing X-pessimism and the correct value at a gate when it is X-pessimistic is performed statically prior to simulation. Only a look up of the efficiently organized data files is performed during simulation. As a result, the present system incurs a much lower performance overhead during simulation compared to the system suggested in U.S. Pat. No. 8,650,513 in which multiple value combinations are simulated in real time when a reconvergent input net to the logic cone driving an X-pessimism candidate has an X value on it. Similarly, the present system incurs a much lower simulation performance overhead compared to the system proposed in U.S. Pat. Nos. 8,402,405 and 9,058,452 in which a full Boolean formal analysis is performed at simulation time on the logic cone driving a gate with an X at its output.

DESCRIPTION OF THE FIGURES

FIG. 1: Typical IC design flow
FIG. 2: X-pessimism in an XOR gate
FIG. 3: X-pessimism in an AND-OR MUX
FIG. 4: MUX with bypass to fix X-pessimism
FIG. 5: Simple illustration of the present invention used to enable X-accurate gate-level simulation
FIG. 6: Detailed embodiment of X-accurate gate-level simulation
FIG. 7: Embodiment showing netlist input and data file output for X-accurate gate-level simulation
FIG. 8: Mux with data-driven VPI correction
FIG. 9: Pictorial representation of $Sym(i_1, \ldots, i_k)$
FIG. 10: Deriving f0 from Ckt0
FIG. 11: SAT solver to analyze potential X-pessimism
FIG. 12: BDD to analyze potential X-pessimism

DETAILED DESCRIPTION OF THE INVENTION

A description of the invention including the various methods and systems therein and some embodiments thereof is provided in this section in sufficient detail that a person skilled in the art would be able to reproduce them. The description herein is also sufficiently general to enable skilled practitioners to realize straightforward variations and derivations. As such, this description must be interpreted in the widest scope possible.

As illustrated in FIG. 5, the present invention in its various embodiments seeks to provide a software tool or computer system to enable the efficient completion of accurate gate-level simulation in the presence of X values and the X-pessimism effects thereof.

An illustrative embodiment is as shown in FIG. 6 wherein the methods and systems suggested in the present invention receive the gate-level netlist as input and perform Boolean analysis statically prior to simulation to determine potentially X-pessimistic gates and the X-pessimism-causing value combinations at their input cones, such that this information is stored in data files subsequently used during gate-level simulation to detect and correct X-pessimism on the fly.

Precise Characterization of Potential X-Pessimism:

As stated earlier in the present disclosure, a gate N is potentially 0 (or 1)-X-pessimistic if there is an assignment of values from the set {0, 1, X} to the inputs in the combinational logic cone of N such that simulation value of N is X under these conditions, and the hardware value of N is 0(1) under the same conditions.

A precise formulation of when simulation produces an X is provided as follows: Let $i_1, \ldots, i_k$ be inputs in the logic cone of N such that each $i_j \in \{0, 1, X\}$. Let the function $Sym(i_1, \ldots, i_k)$ map to true (1) if and only if for the $i_1, \ldots, i_k$ input combination, the value at N is X. Else $Sym(i_1, \ldots, i_k)$ maps to false (0). A 2-bit encoding is used internally to represent the 3 possible values for each $i_j$ and the logic cone of N. Without loss of generality, we use an encoding in which 00 represents 0, 01 represents 1, and 11 represents X. $Sym(i_1, \ldots, i_k)$ then becomes a function mapping a Boolean input to a Boolean output with 2 k input variables. This is shown in FIG. 9.

A second function is provided that indicates when the real value or the circuit value of N is 0(1). Let $Ckt0(j_1, \ldots, j_k)$, such that each $j_j \in \{0, 1\}$, be the Boolean input to Boolean output function that is true (1) if the assignment of values to $j_1, \ldots, j_k$ produces a hardware value of 0 at N, and a false (0) otherwise. An analogous definition holds for $Ckt1(j_1, \ldots, j_k)$. The formulation of potential X-pessimism can be done equivalently using a single function $Ckt(j_1, \ldots, j_k)$ rather than the separate $Ckt0(j_1, \ldots, j_k)$ and $Ckt1(j_1, \ldots, j_k)$ stated here, as a skilled practitioner would readily recognize.

In order to cause X-pessimism wherein the actual hardware value is a 0, an input assignment must exist from the values $\{0, 1, X\}$ to each input of $Sym(i_1, \ldots, i_k)$ such that $Sym(i_1, \ldots, i_k)$ evaluates to 1 (i.e. simulation produces an X), and $Ckt0(j_1, \ldots, j_k)$ evaluates to 1 when $j_j$ is assigned to $i_j$ when $i_j$ is a 0 or 1, and for all the value combinations on the $j_j$ for which $i_j$ is an X. In order to achieve this in a monolithic formulation, a function $F_0(i_j, \ldots, i_k, q_1, \ldots, q_k)$ is derived from $Ckt0(j_1, \ldots, j_k)$ such that it is nominally the same as $Ckt0(j_1, \ldots, j_k)$ except that each $j_j$ of $Ckt0(j_1, \ldots, j_k)$ is an internal variable in $F_0(i_1, \ldots, i_k, q_1, \ldots, q_k)$ and is implemented in logic as "if $i_j$ is an X, $j_j$ equals $q_j$; else if $i_j$ is 1, $j_j$ equals 1; else if $i_j$ is 0, $j_j$ equals 0;". The $q_j$ variables are two-valued (0/1-valued) free inputs. This is shown in FIG. 10.

With an appropriate substitution of variables, the potential X-pessimism conditions in which the real hardware evaluates to 0 (henceforth called the "0 potential X-pessimism condition") are derived as values of $i_1, \ldots, i_k$, satisfying the Quantified Boolean Formula (QBF) $\exists i_1, \ldots, i_k$ $Sym(i_1, \ldots, i_k)$ $\forall q_1, \ldots, q_k$ $F_0(i_1, \ldots, i_k, q_1, \ldots, q_k)$ (henceforth called "the QBF formula"). This can be stated in words as "there is (exists) a combination of the $i_1, \ldots, i_k$ variables such that the conjunction of $Sym(i_1, \ldots, i_k)$ and $F_0(i_1, \ldots, i_k, q_1, \ldots, q_k)$ is 1 for all combinations of the $q_1, \ldots, q_k$ variables. In other words, for this combination of the $i_1, \ldots, i_k$ variables (some of whom are X valued), the simulator outputs an X at the X-pessimistic gate while the actual hardware produces a 0 irrespective of the 0/1 combination assumed by the subset of $i_1, \ldots, i_k$ that are at X.

Note that as before, the $i_1, \ldots, i_k$ variables are implemented as 2-bit encoded ternary-valued variables and the $q_1, \ldots, q_k$ variables are two-valued (0/1-valued) binary variables. The $\exists i_1, \ldots, i_k$ operator is well known in literature as the "there-exists operator" and imposes the requirement that the sub-formula to its right in the expression be satisfiable for one combination of values on the $i_1, \ldots, i_k$ inputs. The $\forall q_1, \ldots, q_k$ operator is well known in literature as the "for-all operator" and imposes the requirement that the sub-formula to its right be satisfiable for all combinations of values on the $q_1, \ldots, q_k$ inputs. These operators and the notion of a Quantified Boolean Formula, methods to find variable assignments satisfying a QBF formula, and QBF solver software applying such methods are all widely understood and available in the public literature. Any such QBF solver software can be applied in the present invention.

A formulation can be derived isomorphically for the potential X-pessimism conditions in which the real hardware produces a 1 (henceforth called the "1 potential X-pessimism condition").

In one embodiment, the conditions causing 0(1) potential X-pessimism can be determined using QBF algorithms based on any general purpose SAT solver to enumerate the assignments to $i_1, \ldots, i_k$ satisfying the QBF formula. This is shown in FIG. 11.

SAT solver technology and its embodiments in SAT solver engines as well as QBF algorithms and their embodiments in QBF solver engines are widely available in the public domain. The typical SAT-based QBF solver engine is optimized to efficiently obtain one satisfying assignment or to indicate the absence of any such assignment. As such, a SAT-based QBF solver embodiment would be efficient in the present invention as a means to indicate an absence of 0(1) potential X-pessimism. Whereas it can be applied in the present invention to enumerate all assignments satisfying the QBF formula, its use as such would not be very efficient.

In another embodiment, all the 0(1) potential X-pessimism conditions satisfying the QBF formula can be determined using Binary Decision Diagram (BDD)-based representations of the functions constituting the formula and, correspondingly, BDD-based implementations of the operators in the QBF formula. The use of BDDs to represent Boolean functions, as well as Boolean operations using BDDs and software based on them, is widely known and available in the public domain. Many variations on the basic BDD representation are also known and available in the public domain. In additional embodiments, many of these BDD variations are applied for the same purpose. Without loss of generality, in this disclosure all such embodiments are referred to as being based on BDDs. In such a BDD-based method, all potential X-pessimism conditions are obtained directly in a BDD-based representation. This is shown in FIG. 12. The quantification operation in the BDD-based approach may be applied in a single step or separately in different embodiments.

In some embodiments of the present invention, the above described methods are applied on a sequential logic cone of the potential X-pessimism candidates to determine the potential X-pessimism conditions.

In some embodiments of the present invention, the sequential cone is derived as a timeframe unrolling through flip-flops of the logic driving a potential X-pessimism candidate. The unrolling is performed up to a pre-specified number of timeframes.

Representation of the Potential X-Pessimism Conditions:

In some embodiments of the present invention, the potential X-pessimism conditions for each gate that is potentially X-pessimistic (henceforth referred to as "lookup data") are stored in a computer readable form such that the simulator refers to these conditions during simulation to determine if a certain candidate is 0(or 1) X-pessimistic at that simulation instant.

In some embodiments of the present invention, the computer readable form used to store the lookup data is a tabular representation of the truth table, or a condensed version thereof, of the aforementioned potential X-pessimism combinations. Various methods are known and software available for tabular representations that can be used for this purpose.

In some embodiments of the present invention, the computer readable form used to store the lookup data is a representation of the BDD of the aforementioned potential X-pessimism combinations. Such a representation is graphical in nature such that it has a single root, no cycles and such that each node in the graph, except for the leaf nodes, represents an input to the logic cone and each outgoing edge from a node represents a distinct value of that input. Each root-to-leaf path in such a graph represents a combination of values on the inputs ending in a leaf node indicating the value produced at the output of the logic cone for that combination of inputs. Henceforth, such a representation of the potential X-pessimism combinations is referred to as "the graphical representation".

In some embodiments of the present invention in which the lookup data is represented in the aforementioned graphical manner, the lookup during simulation is performed as a traversal or a walk of a path in the graph from the root of the graph to a leaf based on the values of the logic-cone inputs observed in simulation.

Whereas many embodiments may be envisioned, by practitioners well versed in the art, for utilizing the aforementioned lookup data during simulation, in a preferred embodiment of the present invention, the lookup data is stored in computer files that are read in during simulation to create the appropriate tabular or graphical data structures in memory that are subsequently used by software code adjunct to the simulator to perform the aforementioned lookups. This is the preferred approach since it has almost no overhead on the compilation time and, overall, on the time required to start the simulation.

In some embodiments of the present invention, the lookup data is stored as data within the testbench or its adjunct software code and is compiled along with testbench and the adjunct software code prior to the start of simulation.

In some embodiments of the present invention, the lookup data is stored as logic expressions, gates or execution statements in the testbench and compiled along with the testbench and design prior to simulation.

In some embodiments of the present invention, the lookup data is synthesized onto an emulator or hardware-accelerator used in conjunction with simulation or emulation.

Details of the Flow:

In some embodiments of the present invention, the design is available in a partitioned form and the lookup data is obtained separately each partition.

In some embodiments of the present invention, the lookup data is only obtained for a subset of the partitions in the partitioned design.

In some embodiments of the present invention, the lookup data is only obtained for a subset of the partitions in the partitioned design, and previously obtained lookup data is used for some or all of the other partitions.

In some embodiments of the present invention, the lookup data is obtained concurrently for the various partitions.

In some embodiments of the present invention, the lookup data is obtained without assuming any contextual values on nets and gates in the design. In other words, no setup conditions are applied and all values (0, 1 or X) are assumed possible on any net or gate.

In some embodiments of the present invention, the lookup data is obtained in the context of values applied on nets and gates based on setup conditions like constants, reset waveforms, initialization sequences and other similar parameters.

In some embodiments of the present invention, the lookup data is obtained in the context of values applied on nets and gates based on the application of a simulation testbench.

In some embodiments of the present invention, the lookup data is used in simulation by the addition of an adjunct part to the simulation testbench in the following manner:

The nets that form the inputs of the logic cones in the lookup data are marked for change-monitoring during simulation.

When there is a change in the value of any of these nets in simulation, the simulator cedes control to an adjunct portion of the testbench, which determines which potential X-pessimism gates must be analyzed given the observed value changes (henceforth called "the selected gates").

The aforementioned adjunct code refers to the lookup data for each of the selected gates in the manner suggested previously in this disclosure to determine if it is X-pessimistic, and if so, to determine the actual value at the output of that gate in hardware (henceforth called "the actual value").

For each X-pessimistic gate, the actual value is applied on the corresponding net by the adjunct code (i.e. the incorrect X is replaced by the correct value) by using the "force" command in the simulation language, or its equivalent.

In some embodiments of the present invention, the lookup data is obtained in a multi-step process (henceforth called "leaning") in which 1. Potential-X-pessimism analysis is performed on all gates in the design or design partition. Lookup data is stored for all of such gates that are determined to be potentially X-pessimistic.

2. The design is simulated, with the aforementioned adjunct files to the testbench and lookup data, such that X-pessimism is eliminated on the fly. The gates on which a force is applied on-the-fly to correct X-pessimism are noted (henceforth called the "forced nodes").

3. The lookup data is recomputed for the design and only on the aforementioned forced nodes. This is the lookup data that is used henceforth during simulation. Since this lookup data is only on the forced nodes of step 2, the lookup data consists of a much smaller number of monitored nets than in Step 1, as well as a much smaller number of potentially X-pessimistic gates than in Step 1, with the consequence that the simulation runs much faster.

In some embodiments of the present invention, the aforementioned selected gates are arranged in groups and the gates in each group are analyzed for X-pessimism during simulation by referring to the aforementioned lookup data in parallel with the gates in other groups.

In some embodiments of the present invention, such parallel execution is performed using a combination of multiple threads and multiple processes to look up data for each of the aforementioned groups of gates.

What is claimed is:

1. A method for accurate logic simulation of a logic circuit, said method being embodied as a set of computer instructions stored on computer readable media, said computer instructions, when loaded into a computer, causing the computer to perform the steps of said method, said logic circuit having a multiplicity of inputs and one output, each of said inputs and output taking either the logic value 0, or the logic value 1, or a symbolic value, said symbolic value indicating that the said input or output is either unknown, unspecified or not determined to be 0 or 1, said symbolic value represented by a symbol X, said logic circuit being part of a digital integrated circuit, said logic simulation being performed for the purpose of ensuring error-free operation of said digital integrated circuit to be fabricated, the method comprising:

performing, prior to said logic simulation, a Boolean analysis of said logic circuit to determine all input value combinations for said logic circuit so that the value of the logic-circuit output determined by a logic simulator for each of said input value combinations would be the symbol X, whereas the value of the logic-circuit output in the logic circuit to be fabricated would be 0 for said input value combination;

performing, prior to said logic simulation, a Boolean analysis of said logic circuit to determine all additional input value combinations for said logic circuit so that the value of the logic-circuit output determined by the logic simulator for each of said additional input value combinations would be the symbol X, whereas the value of the logic-circuit output in the logic circuit to be fabricated would be 1 for said additional input value combination;

storing in computer readable media, prior to said logic simulation, each of said value combinations of logic-circuit inputs along with the corresponding value of said logic-circuit output in the logic circuit to be fabricated, in such a manner that each of said stored combinations of inputs and output can be retrieved by the logic simulator during said logic simulation of said digital integrated circuit;

said stored value combinations of said logic-circuit inputs and output being represented in a graphical form, said graphical form being a Binary Decision Diagram or a Multi-Valued Decision Diagram, and stored in same said graphical form;

during said logic simulation of said digital integrated circuit, when the observed value combination in said logic simulation at said logic-circuit inputs matches one of said stored logic-circuit input combinations, retrieving said logic-circuit output value stored along with said observed logic-circuit input value combination, said step of matching and retrieval being termed value-lookup, and forcing the logic simulator to apply in said logic simulation at the current simulation time said retrieved logic-circuit output value at said logic-circuit output, said step of forcing being termed X-correction;

and in response to said logic simulation satisfying error free operation of said integrated circuit, providing said error free integrated circuit to a fabrication facility to fabricate said error free integrated circuit.

2. The method of claim 1 in which said determination of value combinations of logic-circuit inputs is performed by evaluating the Quantified Boolean Formulae (QBF) "$\exists i_1, \ldots, i_k \; Sym(i_1, \ldots, i_k) \; \forall q_1, \ldots, q_k \; F_0(i_1, \ldots, i_k, q_1, \ldots, q_k)$" and "$\exists i_1, \ldots, i_k \; Sym(i_1, \ldots, i_k) \; \forall q_1, \ldots, q_k \; F_1(i_1, \ldots, i_k, q_1, \ldots, q_k)$" such that:

the said logic-circuit inputs are numbered from 1 to k;

the variables $i_1, \ldots, i_k$, such that the suffix of each of said i variables corresponds to said logic-circuit input number, are multi-valued variables that can take value 0, 1, or the value X;

the variables $q_1, \ldots, q_k$, such that the suffix of each of said q variables corresponds to said logic-circuit input number, are binary-valued variables;

a variable $q_s$, $1 \leq s \leq k$, from the set of said variables $q_1, \ldots, q_k$, takes the same value as the variable is from the set of said variables $i_1, \ldots, i_k$ when said variable is has the value 0 or 1;

a variable $q_s$, $1 \leq s \leq k$, from the set of said variables $q_1, \ldots, q_k$, is a free variable that is allowed to take either the value 0 or the value 1 when the variable is from the set of said variables $i_1, \ldots, i_k$ has a value that is the symbol X;

$Sym(i_1, \ldots, i_k)$ is a logic function;

$Sym(i_1, \ldots, i_k)$ takes the value 0 if said logic-circuit output would evaluate to 0 in said logic simulation when the values taken by said variables $i_1, \ldots, i_k$ are applied to said logic-circuit inputs;

$Sym(i_1, \ldots, i_k)$ takes the value 1 if said logic-circuit output would evaluate to 1 in said logic simulation when the values taken by said variables $i_1, \ldots, i_k$ are applied to said logic-circuit inputs;

$Sym(i_1, \ldots, i_k)$ takes the value that is the symbol X if said logic-circuit output would evaluate to a value other than 0 or 1 in said logic simulation when the values taken by said variables $i_1, \ldots, i_k$ are applied to said logic-circuit inputs;

$F_0(i_1, \ldots, i_k, q_1, \ldots, q_k)$ is a logic function;

$F_0(i_1, \ldots, i_k, q_1, \ldots, q_k)$ evaluates to 1 if said logic circuit output takes the value 0 when the values taken by said variables $q_1, \ldots, q_k$ are applied to said logic-circuit inputs;

$F_0(i_1, \ldots, i_k, q_1, \ldots, q_k)$ evaluates to 0 if the said logic circuit output takes the value 1 when the values taken by said variables $q_1, \ldots, q_k$ are applied to said logic-circuit inputs;

$F_1(i_1, \ldots, i_k, q_1, \ldots, q_k)$ is a logic function;

$F_1(i_1, \ldots, i_k, q_1, \ldots, q_k)$ evaluates to 1 if the said logic circuit output takes the value 1 when the values taken by said variables $q_1, \ldots, q_k$ are applied to said logic-circuit inputs;

$F_1(i_1, \ldots, i_k, q_1, \ldots, q_k)$ evaluates to 0 if the said logic circuit output takes the value 0 when the values taken by said variables $q_1, \ldots, q_k$ are applied to said logic-circuit inputs.

3. The method of claim 2 in which said formulae are evaluated using Binary Decision Diagram data structures and algorithms.

4. The method of claim 2 in which said formulae are evaluated using Boolean Satisfiability (SAT) data structures and algorithms.

5. The method of claim 1 in which said value combinations of said logic-circuit inputs and output, said value combinations stored in graphical form, are read into said logic simulation as graphical data, and graphical traversal of said graphical data is performed during said logic simulation to determine whether the observed input value combination for said logic circuit is one of the said stored input value combinations for said logic circuit, and to determine the value of said logic-circuit output for said observed input value combination.

6. The method of claim 1 in which the said value combinations of said logic-circuit inputs and output are represented and stored as logic expressions or hardware description language expressions, and stored in same form.

7. The method of claim 6 in which said value combinations stored as logic expressions or hardware description language expressions are compiled into said logic simulation, and a logic evaluation of said stored logic expressions or hardware description language expressions is performed during said logic simulation to determine whether the observed input value combination for said logic circuit is one of the said stored input value combinations for said logic circuit, and to determine the value of said logic-circuit output for said observed input value combination.

8. A method for accurate logic simulation of a digital integrated circuit in which the method of claim 1 is applied to a multiplicity of said logic circuits in said digital integrated circuit, each said logic-circuit output corresponding to a signal in said integrated circuit.

9. The method of claim 8, the method comprising:
partitioning said digital integrated circuit into multiple blocks;
performing said steps prior to logic simulation separately on each of said blocks.

10. The method of claim 9 in which said steps prior to logic simulation are performed concurrently using parallel execution, said steps being performed on all or a subset of the said blocks.

11. The method of claim 8 in which the value-lookup for said multiple logic circuits is performed concurrently using parallel execution.

12. The method of claim 8 in which the set of said logic-circuit outputs for which said value combinations of logic circuit inputs and output are stored, is reduced after said logic simulation to only include said logic-circuit outputs for which the X-correction step is applied in said logic simulation.

13. A method for multiple logic simulations of a digital integrated circuit, the method comprising:
applying the method of claim 8 to perform the first of said multiple logic simulations;
applying the method of claim 12 to obtain the said reduced set of logic-circuit outputs during the said first logic simulation;
using the said stored value combinations for the said reduced set of logic-circuit outputs for the value-lookup step and the X-correction step during the second and subsequent of the said multiple logic simulations.

14. The method of claim 8, in which the said multiplicity of logic circuits to which the method of claim 1 is applied, are specified manually.

15. The method of claim 1 in which the said value combinations are stored as data files on a digital storage medium and read in as data at the start of said logic simulation.

16. The method of claim 1 in which the said value combinations are stored as data files on a digital storage medium and compiled with hardware-description-language source code for said integrated circuit and a simulation environment for said integrated circuit.

17. The method of claim 1 in which said logic simulation is performed using a software logic simulator.

18. The method of claim 1 in which said logic simulation is performed using a software logic simulator accompanied by a hardware accelerator for enhancing simulation speed.

19. The method of claim 1 in which said logic simulation is performed using a hardware emulator.

* * * * *